United States Patent [19]

Alais et al.

[11] 3,930,303

[45] Jan. 6, 1976

[54] METHOD FOR MANUFACTURING COMPACT THERMOELECTRIC MODULES

[75] Inventors: Michel Alais; André Stahl, both of Orsay, France

[73] Assignee: Compagnie Industrielle des Telecommunications Cit-Alcatel, Paris, France

[22] Filed: Jan. 24, 1975

[21] Appl. No.: 543,742

[30] Foreign Application Priority Data

Feb. 15, 1974 France .............................. 74.05258

[52] U.S. Cl. ....................... 29/573; 29/583; 29/589
[51] Int. Cl.² .......................................... B01J 17/00
[58] Field of Search ............ 29/573, 576 J, 583, 589

[56] References Cited
UNITED STATES PATENTS

| | | | |
|---|---|---|---|
| 2,289,152 | 7/1942 | Telkes | 29/573 |
| 3,279,036 | 10/1966 | Fuller | 29/573 |
| 3,626,583 | 12/1971 | Abbott | 29/573 |
| 3,851,381 | 12/1974 | Alais | 29/573 |

*Primary Examiner*—W. Tupman
*Attorney, Agent, or Firm*—Sughrue, Rothwell, Mion, Zinn & Macpeak

[57] ABSTRACT

A manufacturing method of thermoelectric modules having slight internal resistance comprising very thin plates of P type and of N type stacked alternately and connection bridges between each plate of P type and the neighbouring plates of N type. The method is characterized in that after cutting out of the plates of P and N type an alternate sequence of plates of P type and of N type is formed by assembling plates, and by inserting, between two plates, insulating sheets every other one of which extends beyond the upper face of the assembly, the others extending beyond the lower face and then by immersion of the lower and upper faces in brazing material.

1 Claim, 5 Drawing Figures

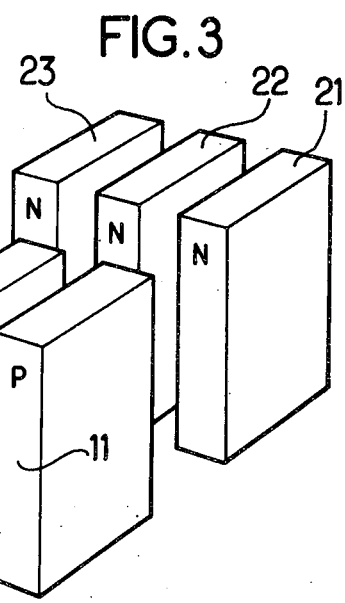
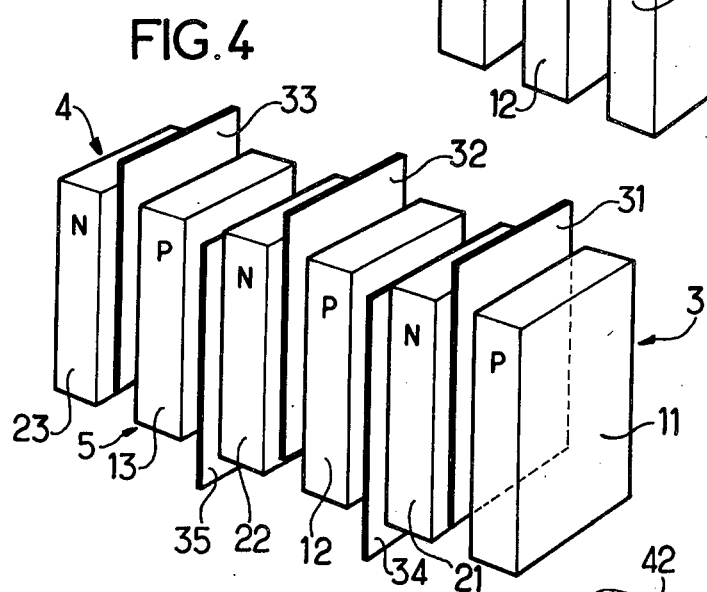
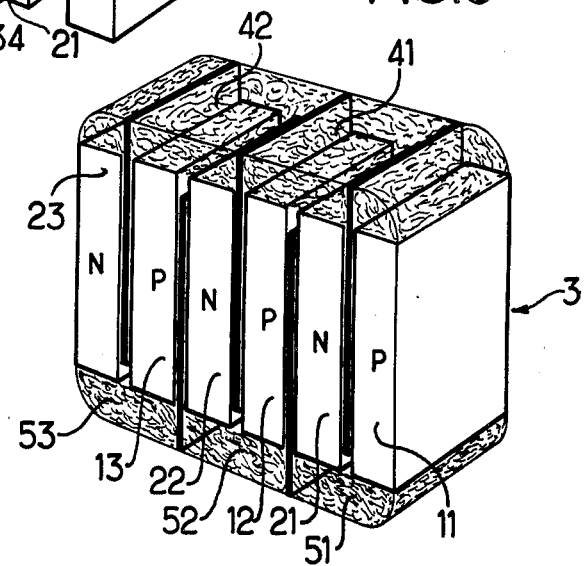

METHOD FOR MANUFACTURING COMPACT THERMOELECTRIC MODULES

BACKGROUND OF THE INVENTION

1. Field of the Invention

The present invention relates to a method for manufacturing compact thermoelectric modules.

2. Description of the Prior Art

Thermoelectric modules comprising P type elements and N type elements stacked alternately, each element of one type being connected to the neighbouring elements which are of the other type by connection bridges, in which the P and N elements are very thin plates on whose edge the connection bridges are arranged, are known.

The modules are usually formed manually and the method for manufacturing such modules according to the invention is particularly simple and makes substantial time saving possible.

SUMMARY OF THE INVENTION

The method for manufacturing compact thermoelectric modules following the present invention is characterized in that it consists in:

Taking a block of P type and a block of N type, these blocks having a parallelepipedical shape and the same dimensions;

Cutting up these blocks parallel to one of their faces into plates of P type and into plates of N type;

Forming a stack by assembling alternately the same number of P type and of N type plates after having inserted, between the adjacent faces, insulating sheets which are very thin and have the same dimensions as the plates, the said sheets being arranged so as to be alternately recessed with respect to the plates on one face of the stack and to extend slightly beyond the other face; and Immersing in brazing material the two opposite faces of the stack beyond which the insulating sheets extend.

The following description with reference to the accompanying drawings will make it easier to understant how the invention may be implemented.

BRIEF DESCRIPTION OF THE DRAWINGS

FIG. 3 is an exploded perspective view the two P and N blocks cut up into plates.

FIG. 4 is an exploded perspective view of the P and N stack after assembly.

FIG. 5 is a perspective view of the thermoelectric module obtained by immersing of the lower face and of the upper face of the P and N stack.

DESCRIPTION OF THE PREFERRED EMBODIMENT

Figure 1:
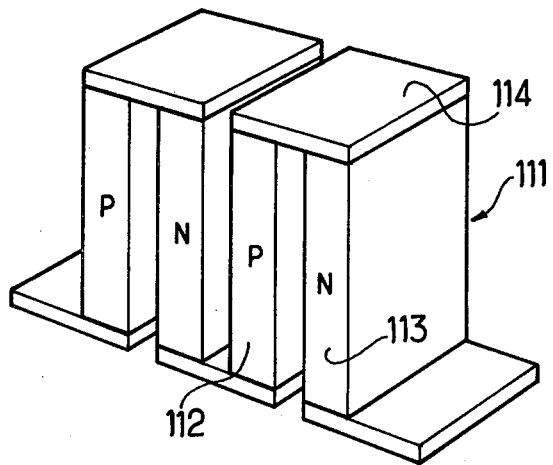
FIG. 1 is a diagramatic perspective view of a part of a compact prior art thermoelectric module.

FIG. 1 shows a thermoelectric module of conventional nature comprising several thermoelectric couples.

These couples 111 comprise very thin plates 112 of P type and 113 of N type, stacked alternately, as well as connection bridges 114 between the plates 112 of P type and 113 of N type.

These connection bridges, being very narrow in relation to their length, dissipate very much less energy than the connection bridges used in more conventional thermoelectric modules constituted by P and N rods.

The method for manufacturing the thermoelectric module according to the invention constituted by plates is set forth with reference to FIGS. 2 to 5.

Figure 2:
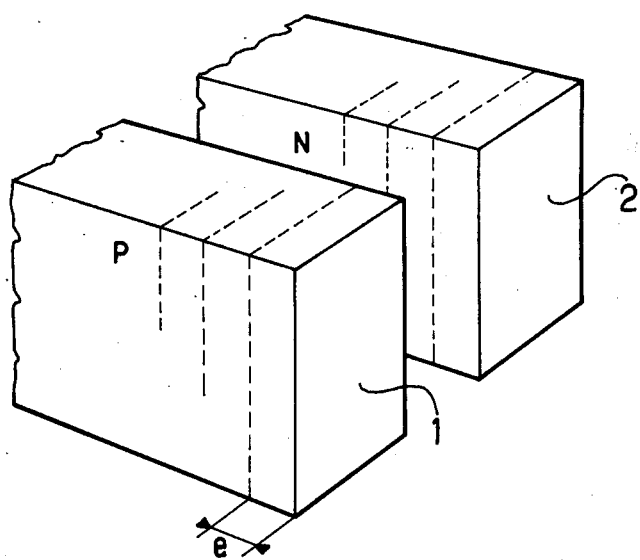
FIG. 2 is a perspective view of parallelepipedical blocks of the P type of the N type.

FIG. 2 shows the block 1 of P type and the block 2 of N type. These blocks are parallelepipedical and have the same dimensions.

The lower faces and upper faces of the blocks 1 and 2 are tinplated, for example, using a given brazing material BiSnSb whose melting point is close to 300°C. It would also be possible to replace the tinplating by nickel plating.

The block 1 is cut up into P plates having a thickness of "$e$" such as 11, 12, 13 (see FIG. 3) and the block 2 is also cut up into N plates having a thickness of "$e$," such as 21, 22, 23 (see FIG. 3).

The cutting planes are orthogonal to the tin-plated faces.

The P plates 11, 12, 13 and the N plates 21, 22, 23 in equal numbers, are stacked on, one another and form a P and N stack 3 constituted by an alternate sequence of P plates and N plates.

Insulating sheets having the same dimensions as the plates are arranged between two consecutive plates.

The sheets 31, 32, 33 arranged between the plates 11, 21, between the plates 12, 22 and between the plates 13, 23, extend slightly beyond the upper face 4 of the stack 3 and are recessed in relation to the lower face 5.

The sheets 34 and 35 arranged between the plates 21 and 12 and between the plates 22 and 13 extend slightly beyond the lower face 5 of the stack 3 (see FIG. 4).

The stack may be held by a mechanical pressing means but it may also be cemented by painting the insulating sheets or the plates with a suitable cement, for example a liquid epoxy cement the excess of which is removed by simple pressure. It is also possible to use sheets consisting of a polyimide film coated with polytetrafluorethylene which withstands brazing temperatures.

FIG. 5 shows the thermoelectric module 50 obtained after immersion of the upper faces 4 and lower faces 5 of the stack 3 in the brazing material. A bridge 41 is formed between the plates 21, 12 and a bridge 42 between the plates 22 and 13 and on the lower face 5, a bridge 51 is formed between the plates 11 and 21, a bridge 52 is formed between the plates 12 and 22 and a bridge 53 is formed between the plates 13 and 23.

Although the means which have just been described appear to provide the greatest advantages for implementing the method according to the invention in a particular technical structure, it will be understood that various modifications may be made thereto without going beyond the scope of the invention and that, more particularly, previous tin-plating or scouring may be effected at any stage previous to the immersion in a brazing material or replaced by any other equivalent previous operation making the adhering of the brazing material on the contiguous material easier without detriment to their electrical or thermoelectrical properties.

We claim:

1. In a method for manufacturing thermoelectric modules including: the steps of stacking very thin plates of P type and very thin plates of N type alternately, and connecting each plate of one type to the neighboring plates which are of the other type by connection bridges arranged on the edge of said plates, the improvement comprising the steps of:
- taking a block of P type and a block of N type, these blocks having a parallelepipedical shape and the same dimensions;
- cutting up these blocks parallel to one of their faces into plates of P type and into plates of N type;
- forming a stack by assembling alternately the same number of plates of P type and of N type while inserting between the adjacent faces, insulating sheets which are very thin and have the same dimensions as the plates with the said sheets being arranged so as to be alternately recessed with respect to the plates on one face of the stack and to extend slightly beyond the other face; and
- immersing in brazing material the two opposite faces of the stack beyond which the insulating sheets extend.

* * * * *